(12) United States Patent
Ueji et al.

(10) Patent No.: US 7,977,697 B2
(45) Date of Patent: Jul. 12, 2011

(54) LIGHT EMITTING DEVICE

(75) Inventors: Yoshinori Ueji, Tokyo (JP); Katsuyuki Okimura, Tokyo (JP)

(73) Assignee: NEC Lighting, Ltd., Tokyo (JP)

( * ) Notice: Subject to any disclaimer, the term of this patent is extended or adjusted under 35 U.S.C. 154(b) by 159 days.

(21) Appl. No.: 12/435,141

(22) Filed: May 4, 2009

(65) Prior Publication Data
US 2009/0302340 A1 Dec. 10, 2009

(30) Foreign Application Priority Data
Jun. 10, 2008 (JP) .................................. 2008-151651

(51) Int. Cl.
*H01L 33/00* (2010.01)
(52) U.S. Cl. .................................. 257/98; 257/E33.067
(58) Field of Classification Search .................... 257/98, 257/E33.067
See application file for complete search history.

(56) References Cited

U.S. PATENT DOCUMENTS
2009/0046456 A1* 2/2009 Urano et al. .................. 362/235
2009/0095967 A1* 4/2009 Masui et al. ..................... 257/98
2009/0103005 A1* 4/2009 Nakazato et al. ............... 349/62
2010/0038662 A1* 2/2010 Fushimi et al. ................. 257/98
2010/0237375 A1* 9/2010 Yamazaki et al. .............. 257/98

FOREIGN PATENT DOCUMENTS
JP 2001-085748 3/2001
* cited by examiner

*Primary Examiner* — Trung Dang
(74) *Attorney, Agent, or Firm* — Young & Thompson

(57) ABSTRACT

The present invention provides a light emitting device which comprises a light emitting element, a mounting board on which the light emitting element is mounted, a metal-made reflector surrounding the side surfaces of the light emitting element on the mounting board, a conductor for electrically connecting the light emitting element with the mounting board, and a sealing resin fitted within the reflector to cover and seal the light emitting element and the conductor. The mounting board includes a metal-made base board, and an insulating board laminated on the base board and formed with a window hole extending therethrough which is larger than the outer periphery of the light emitting element. A mount for carrying the light emitting element thereon is disposed on the base board within the window hole with a clearance defined from side surfaces of the window hole. The conductor straddles the clearance, and electrically connects the wiring pattern formed on the insulating board with the light emitting element and the mount. Then, part of the clearance associated with the area that projects from the conductor to the mounting board is narrower than the rest of the clearance.

6 Claims, 6 Drawing Sheets

LIGHT EMITTING DEVICE

This application is based upon and claims the benefit of priority from Japanese patent application No. 2008-151651, filed on Jun. 10, 2008, the disclosure of which is incorporated herein in its entirety by reference.

BACKGROUND OF THE INVENTION

1. Field of the Invention

The present invention relates to an LED device which is a light emitting device using an LED chip.

2. Description of the Related Art

In general LED devices, a resin is used to seal an LED chip, which is a light emitting element, from the surroundings for purposes of protecting the LED chip. Also, from the fact that a high-power LED device for use in illumination applications self generates a large amount of heat when it is turned on, a metal is used for a board and a reflector in order to radiate this self-generated heat (see JP-2001-85748-A).

FIG. 1 is a vertical sectional view showing the configuration of an LED device described in JP-2001-85748-A. Referring to FIG. 1, this LED device comprises LED chip 1, board 2 on which LED chip 1 is mounted, and reflector 3 including a frame which surrounds side surfaces of LED chip 1 on board 2.

Then, LED chip 1 mounted on board 2, and bonding wire 4 which electrically connects board 2 with LED chip 1 are covered with sealing resin material 5. Sealing resin material 5 is fitted in the frame which forms part of reflector 3. Reflector 3 is made of a metal material such as Al, Cu and the like.

In such a configuration, the coefficient of linear expansion in the sealing resin and reflector are largely different from each other. As a result, when the sealing material for the LED chip is an epoxy-based resin, the sealing material is highly likely to crack due to the thermal expansion of each component member while the LED is turned on, or peeling is highly likely to occur on the interface between the sealing resin and LED chip or on the interface between the sealing resin and reflector, because of the high hardness of the sealing material exhibits.

Thus, as general countermeasures to the above problem, an elastic silicone-based sealing resin is employed to avoid cracks and interfacial pealing even if each component member thermally expands.

As described above, when a silicone-based resin is used for the sealing material for the LED chip in the configuration of FIG. 1, the problems of cracks and interfacial pealing are less likely to occur because the silicone-based resin exhibits a larger coefficient of linear expansion, as compared with the epoxy-based resin.

However, even if the foregoing problem is solved, this configuration suffers from another problem in which the bonding wire for supplying electric power to the LED chip is pulled and broken.

A mechanism involved in the occurrence of this problem will be described. FIG. 2 is a cross-sectional view which schematically shows the configuration of the light emitting device in FIG. 1 to describe the mechanism involved in the occurrence of the problem. In the configuration shown in FIG. 2, a silicone-based resin is fitted in reflector 3 as sealing resin material 5, and this resin covers LED chip 1 and bonding wire 4.

Since the light emitting device is configured as described above, when heat is generated while the LED is turned on, it is anticipated that sealing resin material 5 fitted within reflector 3 will largely expand in the direction in which it moves away from board 2, and consequently bonding wire 4 will be pulled and broken (see FIG. 2). This problem causes a lower reliability of the light emitting device.

SUMMARY OF THE INVENTION

It is an object of the present invention to provide a light emitting device which is capable of solving such problems. An exemplary object of the invention is to prevent lower reliability caused by self heat generation which occurs while the LED is turned on.

One aspect of the present invention is a light emitting device which comprises a light emitting element, a mounting board on which the light emitting element is mounted, a metal-made reflector surrounding side surfaces of the light emitting element on the mounting board, a conductor for electrically connecting the light emitting element with the mounting board, and a sealing resin fitted within the reflector to cover and seal the light emitting element and the conductor.

The mounting board includes a metal-made base board, and an insulating board laminated on the base board and formed with a window hole extending therethrough which is larger than the outer periphery of the light emitting element.

A mount for carrying the light emitting element thereon is disposed on the base board within the window hole with a clearance defined from the side surfaces of the window hole.

The conductor straddles the clearance, and electrically connects the wiring pattern formed on the insulating board with each of the light emitting element and mount.

Further, according to the present invention, part of the clearance associated with the projection area of the conductor to the mounting board is narrower than the rest of the clearance. Alternatively, the conductor is formed in a coil shape, and is retractable. Alternatively, the clearance is filled with a resin which has a lower coefficient of linear expansion than the sealing resin, and the sealing resin is applied on the resin. Alternatively, the insulating board has a thickness smaller than that of the sub-mount on the side on which the light emitting element is mounted.

The above and other objects, features and advantages of the present invention will become apparent from the following description with reference to the accompanying drawings which illustrate examples of the present invention.

DETAILED DESCRIPTION OF THE EXEMPLARY EMBODIMENTS

In the following, exemplary embodiments of the present invention will be described with reference to the drawings.

Figure 1:
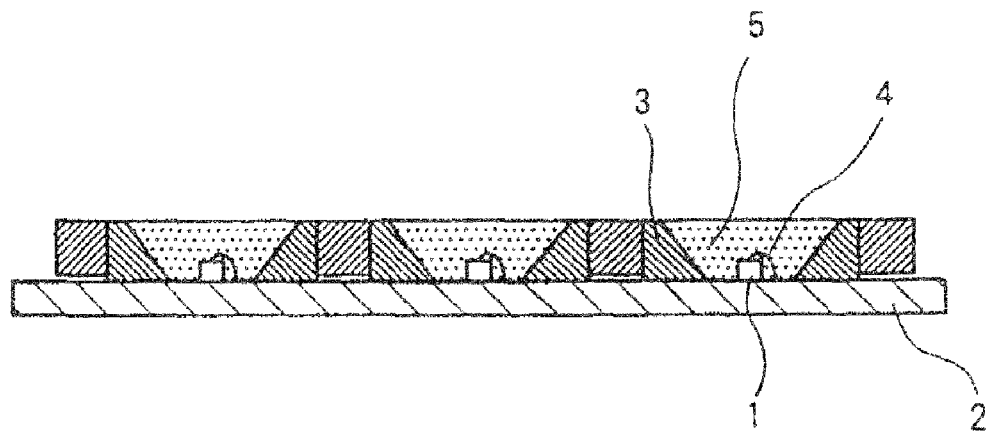
FIG. 1 is a vertical sectional view showing the configuration of an LED device which is described in JP-2001-85748-A.
Figure 2:
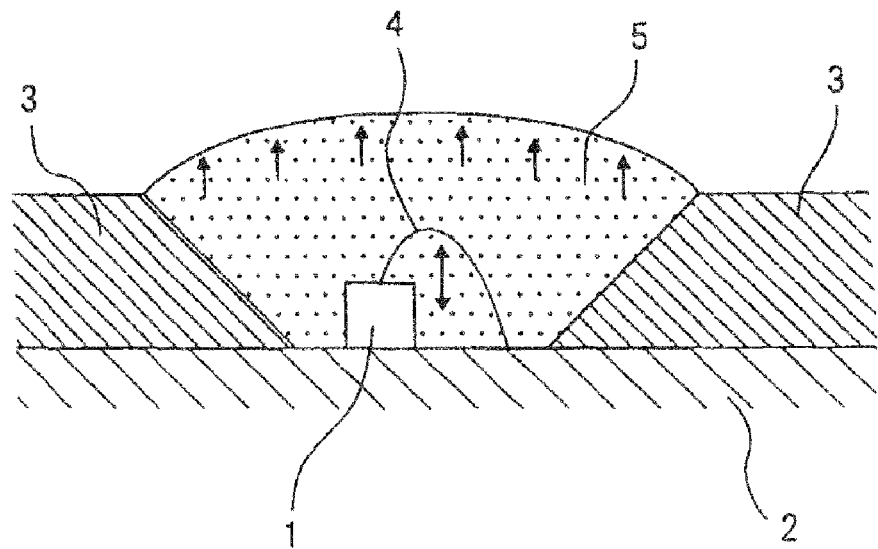
FIG. 2 is a cross-sectional view which schematically shows the configuration of the light emitting device in FIG. 1 to describe a mechanism involved in an occurrence of the problem.
Figure 3A:
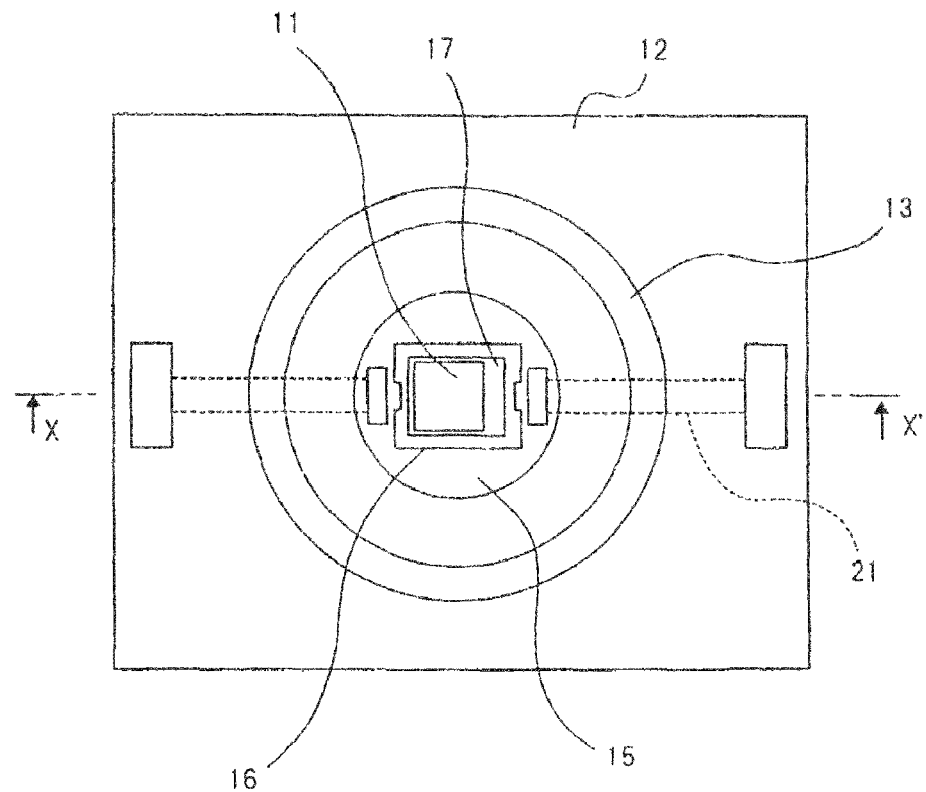
FIG. 3A is a top plan view of a light emitting device according to a first exemplary embodiment of the present invention.
Figure 3B:
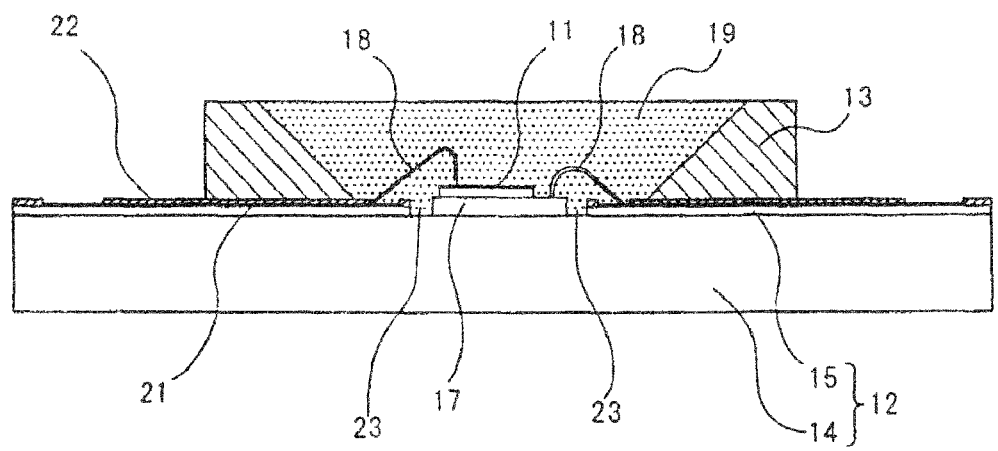
FIG. 3B is a schematic cross-sectional view of the light emitting device.

FIG. 3A is a top plan view of a light emitting device according to a first exemplary embodiment of the present invention, and FIG. 3B is a cross sectional view taken along line X-X' in FIG. 3A.

As shown in these figures, the light emitting device of this exemplary embodiment comprise LED chip 11, mounting board 12 on which LED chip 11 is mounted, and metal-made reflector 13 which is a frame for surrounding side surfaces of LED chip 11 on mounting board 12.

Mounting board 12 includes metal-made base board 14, and insulating board 15 laminated on base board 14.

Reflector 13 has an inner wall surface which inclines in a bowl shape to form a light reflection surface.

Materials for base board 14 and reflector 13 may be metal materials which exhibit relatively high thermal conductivity, and Al, Cu and the like are employed. On the other hand, a glass epoxy board is employed as material for insulating board 15.

Rectangular window hole 16, which is larger than the outer periphery of LED chip 11, extends through insulating board 15, and LED chip 11 is mounted on base board 14 inside of window hole 16 through sub-mount 17.

Further, wiring pattern 21 is routed to make an electrical connection to LED chip 11 on the sides of insulating board 15 and sub-mount 17 opposite to base board 14. Then, wiring pattern 21 on insulating board 15 is covered with resist 22 for protection.

AlN is employed as a material for sub-mount 17 because it exhibits relatively high thermal conductivity and insulating properties.

Then, LED chip 11 mounted on sub-mount 17, and bonding wires 18, which are conductors made of Au, Al or the like for electrically connecting wiring pattern 21 on insulating board 15, LED chip 11, and sub-mount 17 with each other, are covered with sealing resin material 19 made of a silicone-based resin.

Sealing resin material 19 fits within reflector 13. Reflector 13 reflects light radiated from LED chip 11.

In the light emitting device having the configuration described above, metal materials are used for base board 14 and reflector 13, and a silicon-based resin having a higher elasticity than an epoxy-based resin is used for sealing resin material 19. Since the silicone-based resin has a larger coefficient of linear expansion than the relatively hard epoxy-based resin, a larger difference in the coefficient of linear expansion is present between mounting board 12 and reflector 13 and the sealing resin, as compared with the case where an epoxy-based resin is used for the chip sealing material.

Since sub-mount 17 is placed on base board 14 inside of window hole 16 of insulating board 15, window hole 16 is formed large enough to accommodate the outer periphery of rectangular LED chip 11 therein. As a result, clearance 23 is formed between the side surface of window hole 16 of insulating board 15 and the side surfaces of sub-mount 17. Thus, when LED chip 11 and bonding wire 18 are covered with sealing resin material 19 made of silicone-based resin, this clearance 23 is also filled with sealing resin material 19.

Bonding wires 18 straddle clearance 23 in order to electrically connect the wiring pattern on insulating board 15 with LED chip 11 and sub-mount 17.

The aforementioned sealing resin material 19 fits within reflector 13, and when heat is generated while the LED is turned on, sealing resin material 19 expands in a direction in which sealing resin material 19 moves away from mounting board 12. In this event, bonding wires 18 are pulled.

Due to the foregoing factor, as an amount of sealing resin material 19 that expands becomes larger and larger, bonding wire 18 is more likely to break.

The following countermeasures are taken such that this problem will not arise in the light emitting device of this exemplary embodiment.

Figure 4A:
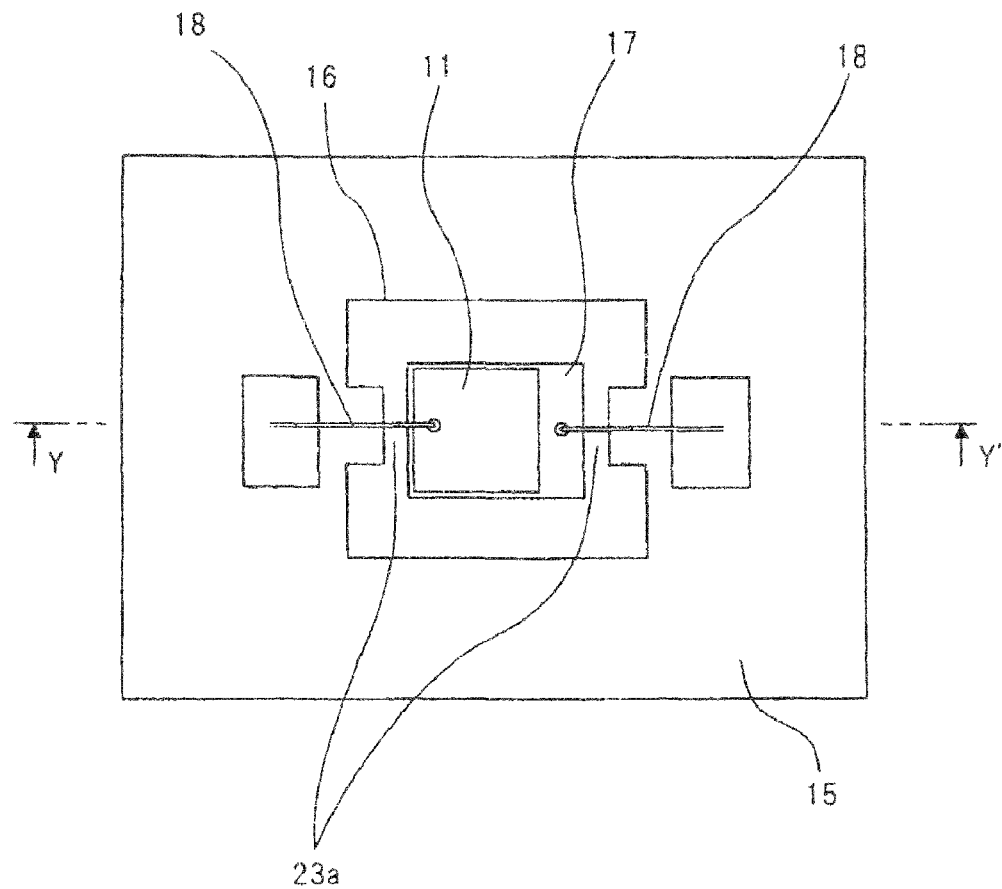
FIG. 4A is a partially enlarged view of FIG. 3.
Figure 4B:
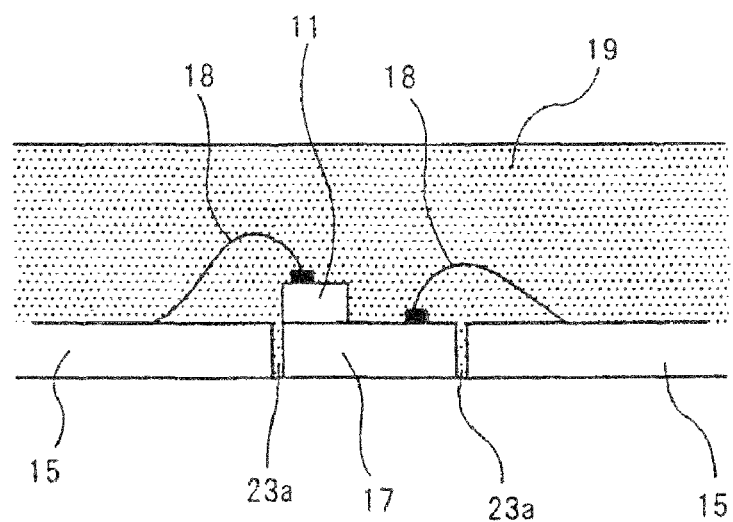
FIG. 4B is a cross-sectional view of FIG. 4A.

In this exemplary embodiment, as shown in FIGS. 4A and 4B, in clearance 23 between the side surface of window hole 16 of insulating board 15 and the side surfaces of sub-mount 17, clearance 23a straddled by each bonding wire 18 is narrower than the rest of clearance 23. Stated another way, in clearance 23 described above, when bonding wires 18 are projected onto mounting board 12, the spacings of the clearances near the wire projected regions are made narrower than the rest of clearance 23. FIG. 4A is an enlarged top plan view showing the surroundings of clearance 23 in FIG. 3A, and FIG. 4B is a schematic cross-sectional view taken along line Y-Y' in FIG. 4A.

In the example shown in FIG. 4A, a side wall of a portion of window hole 16 straddled by each bonding wire 18 is formed to extend convexly toward sub-mount 17. Instead of this shape, the side wall of sub-mount 17 associated with each bonding wire 18 may extend convexly toward the side wall of window hole 16.

In the configuration of this exemplary embodiment, the amount of expansion (amount of movement) of sealing resin material 19 at the position of bonding wire 18 is calculated by the product of the distance from mounting board 12 to bonding wire 18 having the coefficient of linear expansion of sealing resin material 19.

In the configuration as shown in FIG. 4A, with the formation of the convex extension, the distance between bonding wire 18 and mounting board 12 becomes shorter at more locations than when the extension is not formed.

As a result, an amount of sealing resin material 19 that expands at the position of bonding wire 18 decreases, as compared with a configuration without the extension, thus making bonding wire 18 less susceptible to break.

Next, another exemplary embodiment will be shown. Here, the same components as those in the configuration shown in FIGS. 3A and 3B are designated the same reference numerals with the intention of avoiding repeated descriptions, and different components will be mainly described.

Figure 5:
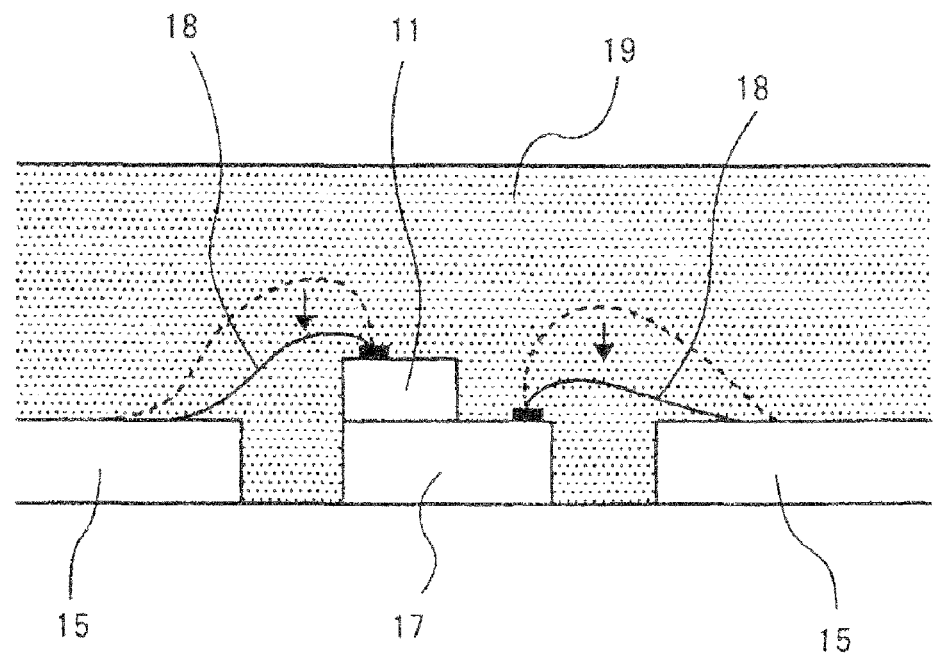
FIG. 5 is a schematic cross-sectional view of a light emitting device according to a second exemplary embodiment of the present invention.

As shown in FIG. 5, in a second exemplary embodiment, binding wires 18 electrically connect between sub-mount 17 and insulating board 15 and between LED chip 11 and insulating board 15. Bonding wires 18 are placed closer to mounting board 12.

This configuration can be made by changing the settings for a movable range of a capillary in a wire bonder or by collapsing the bonding wires after the wires have been connected between pads.

As the distance from mounting board 12 to bonding wire 18 is shorter and shorter, an amount of sealing resin material 19 that expands at the positions of bonding wires 18 decreases, thus making bonding wires 18 less susceptible to break.

Figure 6:
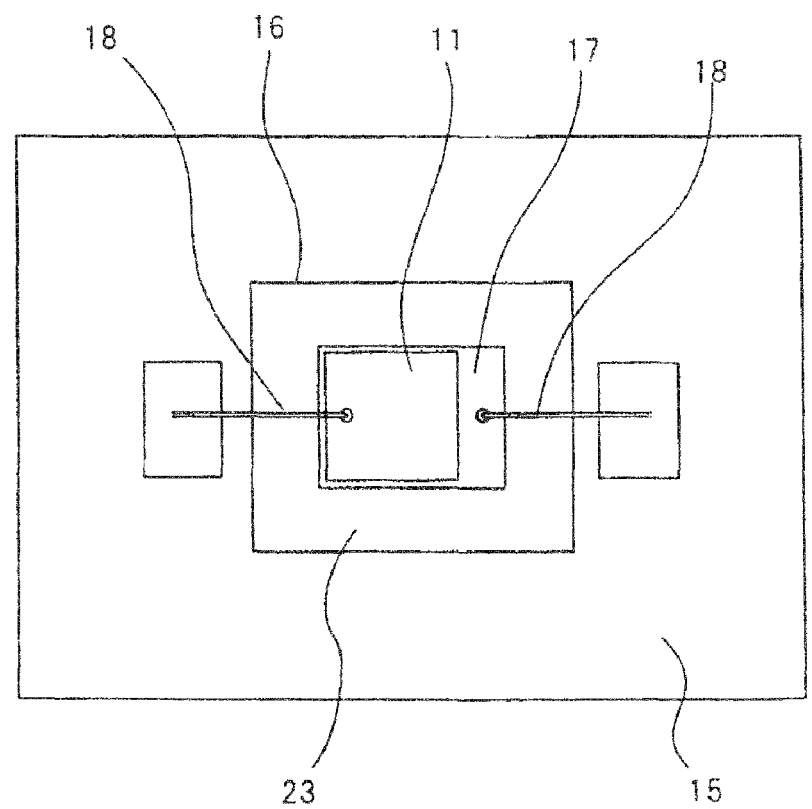
FIG. 6 is a top plan view of the light emitting device according to the second exemplary embodiment of the present invention.

In this second exemplary embodiment, window hole 16 may be in the same shape as the outer peripheral shape of LED chip 11, as shown in FIG. 6. However, this exemplary embodiment can further improve reliability of the light emitting device by combining the same with the structure of the first exemplary embodiment.

Figure 7:
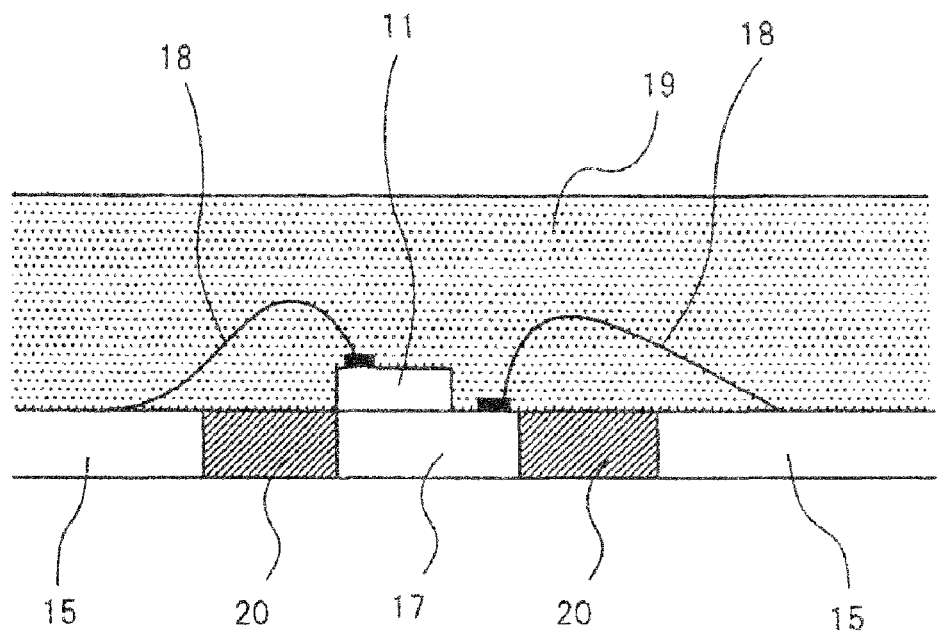
FIG. 7 is a schematic cross-sectional view of a light emitting device according to a third exemplary embodiment of the present invention.

As shown in FIG. 7, in a third exemplary embodiment, resin 20 which exhibits a lower coefficient of linear expansion than sealing resin material 19 is filled in the clearance between the side surface of window hole 16 of insulating board 15 and the side surfaces of sub-mount 17. Further, on the top of insulating board 15, LED chip 11 and bonding wires 18 are covered with sealing resin material 19 made of a silicone-based resin. Resin 20 preferably has a coefficient of linear expansion as close as possible to the coefficient of linear expansion of insulating board 15 and sub-mount 17.

In such a configuration, with resin 20 filled in the clearances, sealing resin material 19 that occupies from bonding wires 18 to mounting board 12 will become a smaller volume than the case where only sealing resin material 19 is applied on the surface of insulating board 12 including the clearances. As a result, an amount of sealing resin material 19 that expands at the positions of bonding wires 18 decreases, as compared with only sealing resin material 19 applied on mounting board 12, thus making bonding wires 18 less susceptible to break.

Likewise, in this exemplary embodiment, window hole 16 may be in the same shape as the outer peripheral shape of LED chip 11, as shown in FIG. 6. However, the third exemplary embodiment can further improve the reliability of the light emitting device by combining the same with the structure of the first exemplary embodiment or the second exemplary embodiment or both the first exemplary embodiment and the second exemplary embodiment.

Figure 8:
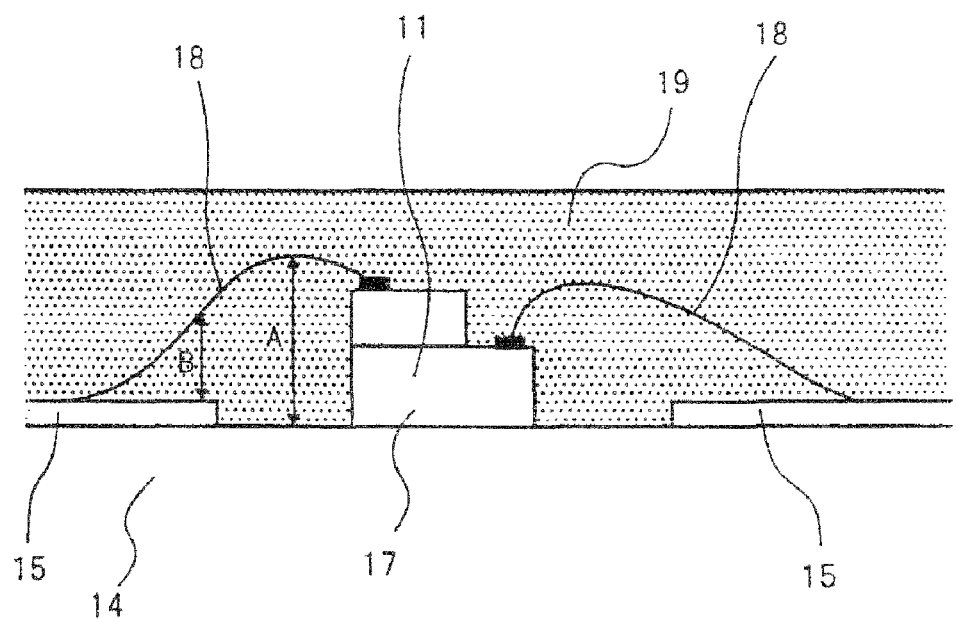
FIG. 8 is a schematic cross-sectional view of a light emitting device according to a fourth exemplary embodiment of the present invention.

As shown in FIG. 8, in a fourth exemplary embodiment, insulating board 15 has a thickness smaller than that of sub-mount 17. Stated another way, the surface of insulating board 15 on which LED chip 11 is mounted is positioned closer to base board 14 than the surface of sub-mount 17 on which LED chip 11 is mounted.

Structurally, in the light emitting device of the present invention, distance A from base board 14 which is exposed in the clearance between insulating board 15 and sub-mount 17 to bonding wire 18 in the vertical direction is different from distance B from insulating board 15 to bonding wire 18 in the vertical direction.

When sealing resin material 19 expands in the direction in which it moves away from mounting board 12 due to heat generated while the LED is turned on, bonding wires 18 are more likely to suffer from problems of break and peeling because a larger difference between distance A and distance B results in a larger difference in the amount that moves between wire portions associated with respective distances A, B.

Accordingly, in the example shown in FIG. 8, the top surface of insulating board 15 is positioned lower than the top surface of sub-mount 17 in order to reduce the distance between distance A and distance B the greatest possible amount.

Further, the top surface of insulating board 15 is preferably positioned at substantially an equal level or lower to the top surface of sub-mount 17 such that light emitted from the side surfaces of LED chip 11 mounted on sub-mount 17 is not prevented by the side surface of insulating board 15. The exemplary configuration of FIG. 8 satisfies such a requirement as well.

Again, in this exemplary embodiment, window hole 16 may be in the same shape as the outer peripheral shape of LED chip 11, as shown in FIG. 6. However, the fourth exemplary embodiment can further improve the reliability of the light emitting device by combining the same with the structure of one or more exemplary embodiments from among the first, second, and third exemplary embodiments.

Figure 9:
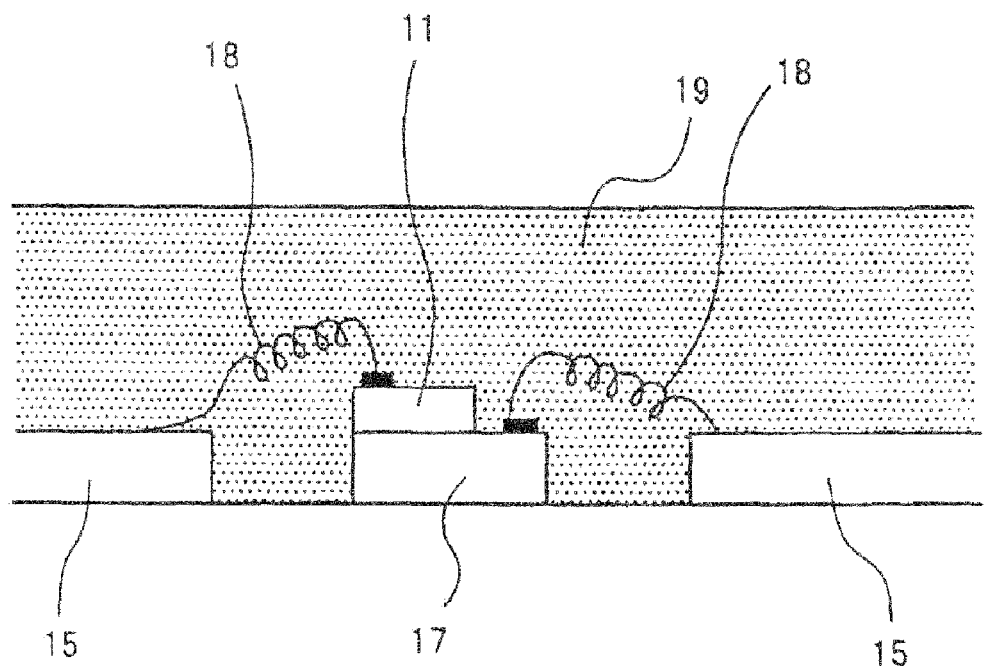
FIG. 9 is a schematic cross-sectional view of a light emitting device according to a fifth exemplary embodiment of the present invention.

As shown in FIG. 9, in a fifth exemplary embodiment, bonding wires 18 themselves are formed in a coil (spring) shape.

In such an exemplary embodiment, bonding wires 18 themselves are retractable. Therefore, even if sealing resin material 19 expands due to heat generated while the LED is turned on in the direction in which it moves away from mounting board 12, bonding wires 18 expand and are not broken.

According to each exemplary embodiment as described above, it is possible to further reduce a stress applied to the bonding wires due to self heat generation while the LED is turned on.

While preferred embodiments of the present invention have been described using specific terms, such description is for illustrative purposes only, and it is to be understood that changes and variations may be made without departing from the spirit or scope of the following claims.

What is claimed is:

1. A light emitting device comprising:
   a mounting board;
   a light emitting element mounted on said mounting board;
   a reflector surrounding said light emitting element on said mounting board;
   a conductor for electrically connecting said light emitting element with said mounting board; and
   a sealing resin fitted within said reflector to cover and seal said light emitting element and said conductor,
   wherein said mounting board includes a metal-made base board, and an insulating board laminated on said base board and formed with a window hole which is larger than the outer periphery of said light emitting element,
   a mount for carrying said light emitting element thereon is disposed on said base board within said window hole with a clearance defined from side surfaces of said window hole,
   said conductor straddles the clearance, and electrically connects a wiring pattern formed on said insulating board with each of said light emitting element and said mount, and
   part of the clearance associated with an area that projects from said conductor to said mounting board is narrower than the rest of the clearance.

2. The light emitting device according to claim 1, wherein a side wall of said window hole associated with said conductor is formed to extend convexly toward a side wall of said mount.

3. The light emitting device according to claim 1, wherein said conductor is formed in a coil shape and is retractable.

4. The light emitting device according to claim 1, wherein said clearance is filled with a resin having a lower coefficient of linear expansion than said sealing resin, and said sealing resin is applied on said resin.

5. The light emitting device according to claim 1, wherein a surface of said insulating board opposite to said base board is positioned closer to said base board than a surface of said mount opposite to said base board.

6. The light emitting device according to claim 1, wherein said sealing resin is a silicone-based resin.

* * * * *